United States Patent
Akiyama et al.

(10) Patent No.: US 11,940,485 B2
(45) Date of Patent: Mar. 26, 2024

(54) INSPECTION APPARATUS AND INSPECTION METHOD

(71) Applicant: Tokyo Electron Limited, Tokyo (JP)

(72) Inventors: Naoki Akiyama, Nirasaki (JP); Susumu Saito, Nirasaki (JP); Hiroyuki Nakayama, Nirasaki (JP); Shigeru Kasai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 387 days.

(21) Appl. No.: 17/286,959

(22) PCT Filed: Oct. 17, 2019

(86) PCT No.: PCT/JP2019/040936
§ 371 (c)(1),
(2) Date: Apr. 20, 2021

(87) PCT Pub. No.: WO2020/085203
PCT Pub. Date: Apr. 30, 2020

(65) Prior Publication Data
US 2021/0389366 A1   Dec. 16, 2021

(30) Foreign Application Priority Data

Oct. 25, 2018   (JP) .................................. 2018-201073

(51) Int. Cl.
*G01R 31/28* (2006.01)
*G01R 1/067* (2006.01)
(Continued)

(52) U.S. Cl.
CPC ......... *G01R 31/287* (2013.01); *G01R 1/0675* (2013.01); *G01R 1/07342* (2013.01);
(Continued)

(58) Field of Classification Search
None
See application file for complete search history.

(56) References Cited

U.S. PATENT DOCUMENTS

| | | | | |
|---|---|---|---|---|
| 2005/0179460 | A1* | 8/2005 | Mizukami | G01N 21/9501 |
| | | | | 324/754.23 |
| 2010/0052721 | A1* | 3/2010 | Chang | G01R 1/0433 |
| | | | | 324/756.02 |
| 2015/0234006 | A1* | 8/2015 | Richards | G01R 31/308 |
| | | | | 324/756.02 |

FOREIGN PATENT DOCUMENTS

| | | |
|---|---|---|
| JP | 9-21916 A | 1/1997 |
| JP | 2004-287368 A | 10/2004 |

(Continued)

*Primary Examiner* — Jas A Sanghera
(74) *Attorney, Agent, or Firm* — Nath, Goldberg & Meyer; Jerald L. Meyer; Tanya E. Harkins

(57) ABSTRACT

In an inspection apparatus for inspecting an inspection target device formed on an inspection object, the inspection target device is a back-illuminated imaging device into which light is incident from a rear surface opposite to a side of a wiring layer. The inspection apparatus includes a stage having the inspection object placed such that the inspection object faces the rear surface. The stage includes a light transmitter made of a light-transmissive material. The inspection object is placed on the light transmitter below which a light illuminator is disposed. The light illuminator includes a flat light guide plate having a facing surface facing the inspection object. A light source is provided laterally outside the light guide plate configured to diffuse light emitted from the light source incident from a side end surface of the light guide plate, and to emit the light as planar light from the facing surface.

5 Claims, 6 Drawing Sheets

(51) Int. Cl.
   *G01R 1/073*   (2006.01)
   *H01L 27/146*   (2006.01)

(52) U.S. Cl.
   CPC ...... *G01R 31/2877* (2013.01); *H01L 27/1464* (2013.01); *H01L 27/14683* (2013.01)

(56) References Cited

FOREIGN PATENT DOCUMENTS

| | | |
|---|---|---|
| JP | 2005-44853 A | 2/2005 |
| JP | 2009-170730 A | 7/2009 |
| JP | 2018-151369 A | 9/2018 |

\* cited by examiner

1

INSPECTION APPARATUS AND INSPECTION METHOD

This is a National Phase Application filed under 35 U.S.C. 371 as a national stage of PCT/JP2019/040936, filed Oct. 17, 2019, an application claiming the benefit of Japanese Application No. 2018-201073, filed Oct. 25, 2018, the content of each of which is hereby incorporated by reference in its entirety.

TECHNICAL FIELD

The present disclosure relates to an inspection apparatus and an inspection method.

BACKGROUND

The inspection apparatus of Patent Document 1 includes a probe card provided above a solid-state imaging device to be inspected and having probe needles formed to be connectable to the solid-state imaging device, a test head configured to provide power or various signals to the solid state imaging device, and a light source configured to irradiate an inspection object with light. In this inspection apparatus, the probe card located above the solid-state imaging device is located below a test head, and the light source is located above the test head. In other words, the solid-state imaging device is located below the probe card, and the light source is located above the probe card. Further, in this inspection apparatus, an opening is formed in the probe card such that the solid-state imaging device located below the probe card is irradiated with light from the light source located above the probe card.

PRIOR ART DOCUMENT

Patent Document

Patent Document 1: Japanese Laid-Open Patent Publication No. 2005-44853

A technique according to the present disclosure allows the inspection of a back-illuminated imaging device to be performed in a short time without impairing the strength of a stage on which an inspection object having the imaging device formed thereon is placed.

SUMMARY

An aspect of the present disclosure is an inspection apparatus for inspecting an inspection target device. The inspection target device formed on an inspection object is a back-illuminated imaging device into which light is incident from a rear surface, which is a surface opposite to a side on which a wiring layer is provided. The inspection apparatus includes a stage on which the inspection object is placed such that the rear surface of the imaging device faces the stage. The stage includes a light transmitter which is made of a light-transmissive material and on which the inspection object is to be placed, and a light illuminator disposed in a region below the light transmitter. The light illuminator includes a flat light guide plate having a facing surface which faces the inspection object, with the light transmitter interposed therebetween, and a light source provided in a region laterally outside the light guide plate. The light guide plate is configured to diffuse light emitted from the light source and incident from a side end surface of the light guide plate inside the light guide plate, and to emit the light as planar light from the facing surface which faces the inspection object.

According to the present disclosure, it is possible to perform inspection of a back-illuminated imaging device in a short time without impairing the strength of a stage on which an inspection object having the imaging device formed thereon is placed.

DETAILED DESCRIPTION

Figure 1:
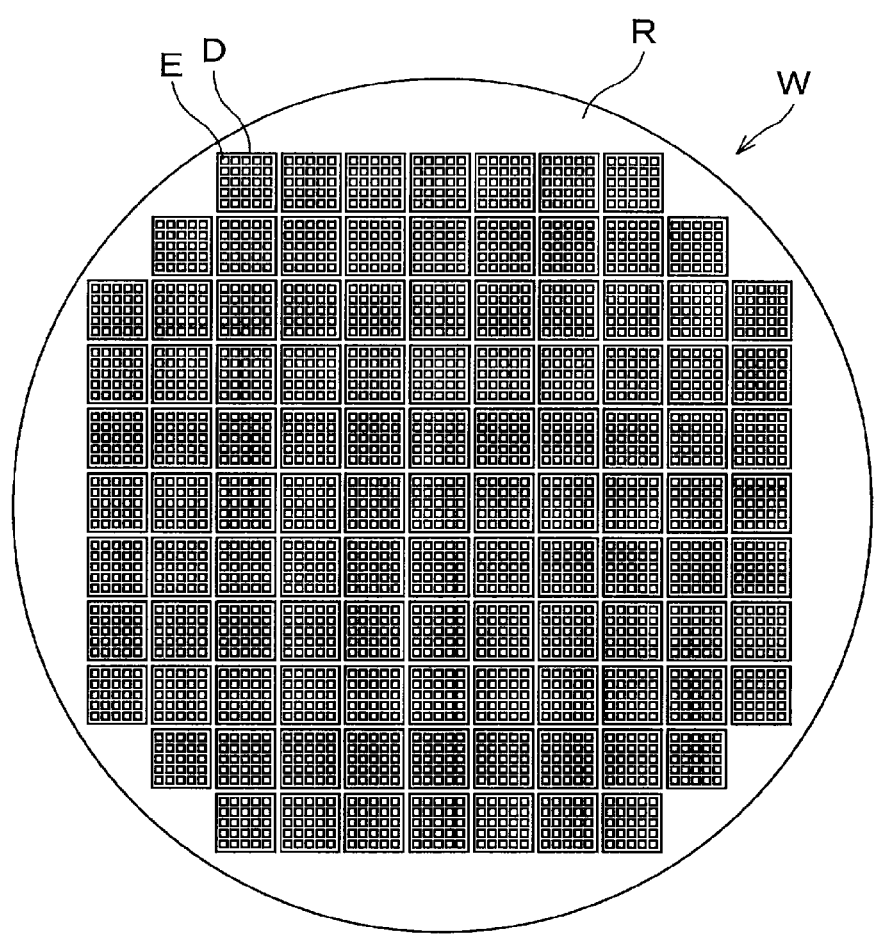
FIG. 1 is a plan view schematically illustrating a configuration of a wafer on which back-illuminated imaging devices are formed.

In a semiconductor-manufacturing process, a large number of semiconductor devices having a predetermined circuit pattern are formed on a semiconductor wafer (hereinafter, referred to as a "wafer"). The formed semiconductor devices are inspected for electrical characteristics, for example, and are sorted into good products and defective products. The inspection of semiconductor devices is performed, for example, in a wafer state before each semiconductor device is divided, using an inspection apparatus called, for example, a prober. In the inspection apparatus, a probe card having a large number of probe needles is provided above a wafer, that is, above semiconductor devices, and the probe card and the semiconductor devices are brought close to each other during inspection. Next, in the state in which the probe needles are in contact with respective electrodes of each semiconductor device, electrical signals are supplied to the semiconductor devices from a test head provided above the probe card via each probe needle. Further, based on electrical signals received by the test head from the semiconductor device via each probe needle, it is determined whether or not the semiconductor device is a defective product.

When a semiconductor device is an imaging device such as a CMOS sensor, unlike other general semiconductor devices, inspection is performed while irradiating the imaging device with light (see Patent Document 1).

In the inspection apparatus of Patent Document 1, as described above, the solid-state imaging device is located below the probe card, and the light source is located above the probe card. Further, in this inspection apparatus, an opening is formed in the probe card such that the solid-state imaging device located below the probe card is irradiated with the light from the light source located above the probe card.

When the light source is located above the probe card as in Patent Document 1, it is necessary to form an opening in the probe card. Thus, the number of probe needles that can be formed in the probe card is limited compared to the case where the opening is not formed. As a result, the inspection time is prolonged. In particular, when the number of electrodes to be brought into contact with the probe needles increases due to, e.g., a memory being mounted on each imaging device, the inspection time is further prolonged.

In recent years, as an imaging device, a back-illuminated imaging device, which receives light incident from a rear surface side opposite a front surface side on which a wiring layer is formed, has been developed. However, in an inspection apparatus in which probe needles are located above imaging devices, when the light source is located above the probe card as in Patent Document 1, that is, when light is emitted from above the imaging devices during inspection, back-illuminated imaging devices cannot be inspected.

As an inspection apparatus for the back-illuminated imaging device, a type of an inspection apparatus configured to radiate light toward a rear surface of the imaging device may be considered, where a cavity is formed inside a stage, on which a wafer W having imaging devices formed thereon is placed, and a light source such as an LED is provided in the cavity so as to radiate light to the rear surfaces of the imaging devices facing the light source. However, in this type, it is considered that the strength of the stage would be insufficient as a result of the cavity formed in the stage.

Therefore, the technique according to the present disclosure enables inspection of the back-illuminated imaging device to be performed in a short time without impairing the strength of the stage.

Hereinafter, the inspection apparatus and the inspection method according to the present embodiment will be described with reference to the drawings. In this specification and the drawings, elements having substantially the same functional configuration are designated by the same reference numerals to omit redundant description.

Since the technique according to the present embodiment is related to inspection of a back-illuminated imaging device, the back-illuminated imaging device will be described first.

Figure 2:
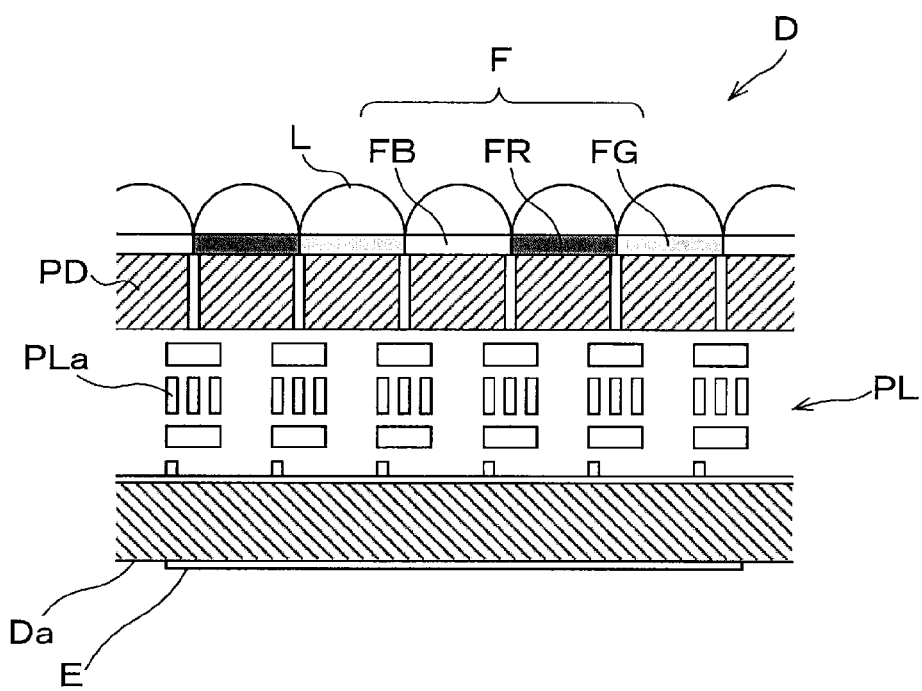
FIG. 2 is a cross-sectional view schematically illustrating a configuration of a back-illuminated imaging device.

FIG. 1 is a plan view schematically illustrating a configuration of a wafer as an inspection object that has back-illuminated imaging devices formed thereon, and FIG. 2 is a cross-sectional view schematically illustrating a configuration of the back-illuminated imaging device.

As illustrated in FIG. 1, a plurality of back-illuminated imaging devices D is formed on a substantially disk-shaped wafer W.

A back-illuminated imaging device D is a solid-state imaging device, and has a photoelectric converter PD which is a photodiode and a wiring layer PL including a plurality of wires PLa, as illustrated in FIG. 2. In the back-illuminated imaging device D, when the wiring layer PL side is the front surface side of the wafer W, light incident from the rear surface side of the wafer W is received by the optical converter PD through an on-chip lens L and a color filter F. The color filter F includes a red color filter FR, a blue color filter FB, and a green color filter FG.

Further, an electrode E is formed on a surface Da of the back-illuminated imaging device D, that is, the front surface of the wafer W, and the electrode E is electrically connected to the wires PLa of the wiring layer PL. The wires PLa are for inputting an electrical signal to a circuit element inside the back-illuminated imaging device D or for outputting an electrical signal from the circuit element to the outside of the back-illuminated imaging device D.

Further, as illustrated in FIG. 1, a non-device-forming region R, in which no back-illuminated imaging device D is formed, is present in an outer peripheral portion of the wafer W.

First Embodiment

An inspection apparatus according to a first embodiment of the present disclosure will be described.

Figure 3:
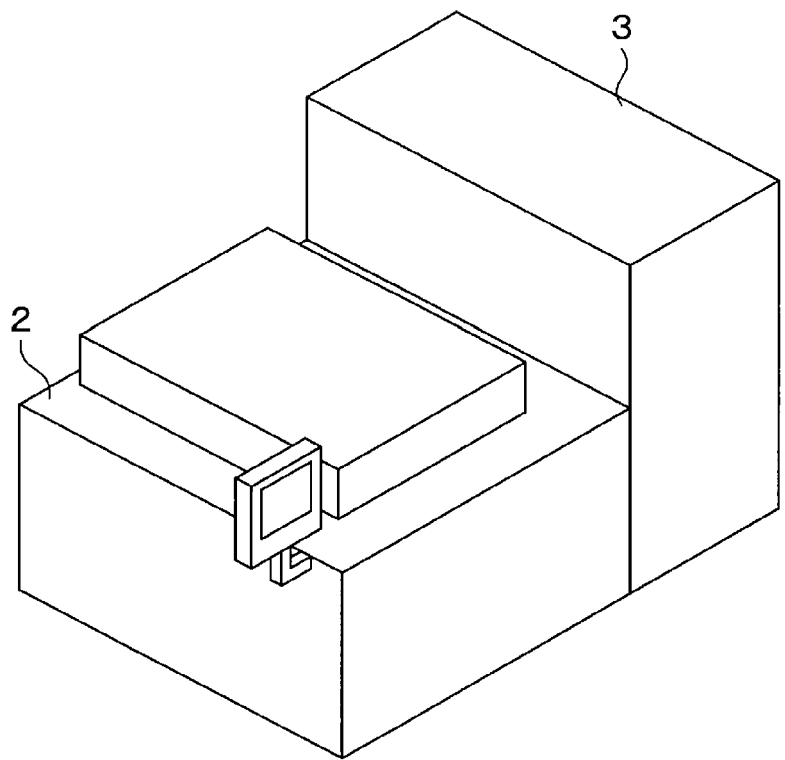
FIG. 3 is a perspective view schematically illustrating a configuration of a prober as an inspection apparatus according to a first embodiment.
Figure 4:
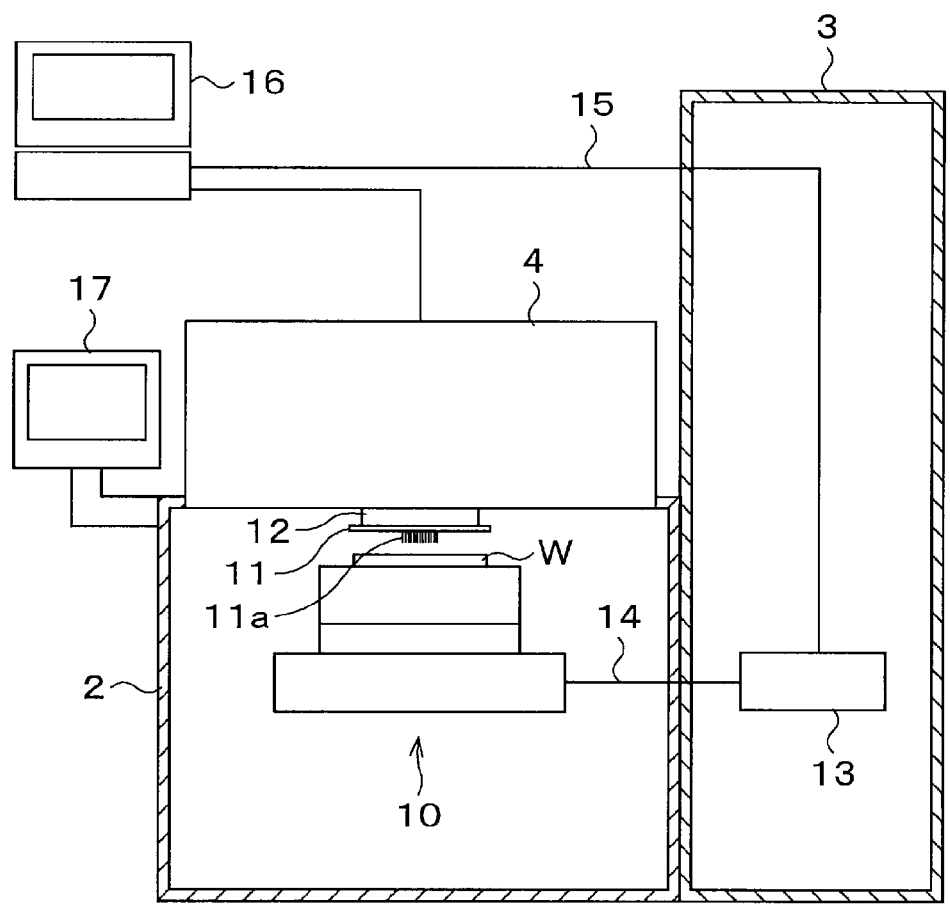
FIG. 4 is a front view schematically illustrating a configuration of a prober as an inspection apparatus according to the first embodiment.

FIGS. 3 and 4 are a perspective view and a front view, respectively, illustrating a configuration of a prober 1 as an inspection apparatus according to the first embodiment. In FIG. 4, a part of the prober 1 of FIG. 3 is illustrated in a cross-sectional view in order to show components housed in an accommodation chamber and a loader of the prober 1 of FIG. 3, which will be described later.

The prober 1 inspects electrical characteristics of each of a plurality of back-illuminated imaging devices D (which, hereinafter, may be abbreviated as an "imaging device D") formed on the wafer W. As illustrated in FIGS. 3 and 4, the prober 1 includes an accommodation chamber 2, a loader 3 disposed adjacent to the accommodation chamber 2, and a tester 4 disposed so as to cover the accommodation chamber 2.

The accommodation chamber 2 is a hollow housing, and has a stage 10 as a stage on which the wafer W is placed. In the stage 10, the non-device-forming region R (see FIG. 1) of the outer peripheral portion of the wafer W is sandwiched such that the position of the wafer W with respect to the stage 10 does not shift, thereby holding the wafer W. The stage 10 is configured to be movable in a horizontal direction and a vertical direction. Thus, by adjusting the relative position between a probe card 11 to be described later and the wafer W, it is possible to bring the electrodes E on the front surface of the wafer W into contact with the probes 11a of the probe card 11.

The probe card 11 is disposed above the stage 10 in the accommodation chamber 2 so as to face the stage 10. The probe card 11 has a large number of needle-shaped probes 11a formed so as to correspond to the electrodes E on the front surface of the wafer W.

The probe card 11 is connected to the tester 4 via an interface 12. When each probe 11a comes into contact with the electrode E of each imaging device D on the wafer W, each probe 11a supplies power to the imaging device D from the tester 4 via the interface 12, or transmits a signal from the imaging device D to the tester 4 via the interface 12.

The loader 3 takes out a wafer W accommodated in a FOUP (not illustrated), which is a transport container, and transports the wafer W to the stage 10 in the accommodation chamber 2. In addition, the loader 3 receives the wafer W, on which inspection of the electrical characteristics of imaging devices D has been completed, from the stage 10 and accommodates the wafer W in the FOUP.

The loader 3 has a base unit 13 as a controller for controlling, for example, a power supply. The base unit 13 is connected to the stage 10 via a wire 14 and is connected to a tester computer 16 via a wire 15. The base unit 13 controls an illumination operation by a light illuminator 40, which will be described later, in the stage 10 based on the input signal from the tester computer 16. The base unit 13 controls a temperature adjustment mechanism 50, which will be described later, of the stage 10 based on a temperature measurement mechanism (not illustrated) of the stage 10. The base unit 13 may be provided in the accommodation chamber 2.

The tester 4 has a test board (not illustrated) that reproduces a part of the circuit configuration of a motherboard on which the imaging device D is to be mounted. The test board is connected to the tester computer 16. The tester computer 16 determines whether the imaging device D is good or poor based on the signal from the imaging device D. By replacing the test board in the tester 4, it is possible to reproduce the circuit configuration of multiple types of motherboards.

In addition, the prober 1 includes a user interface 17. The user interface 17 is for displaying information for a user or for allowing the user to input an instruction, and includes, for example, a display panel having a keyboard or a touch panel.

In the prober 1 having each of the parts described above, when inspecting the electrical characteristics of the imaging device D, the tester computer 16 transmits data to the test board connected to the imaging device D via each probe 11*a*. Further, the tester computer 16 determines whether the transmitted data have been correctly processed by the test board based on electrical signals from the test board.

Figure 5:
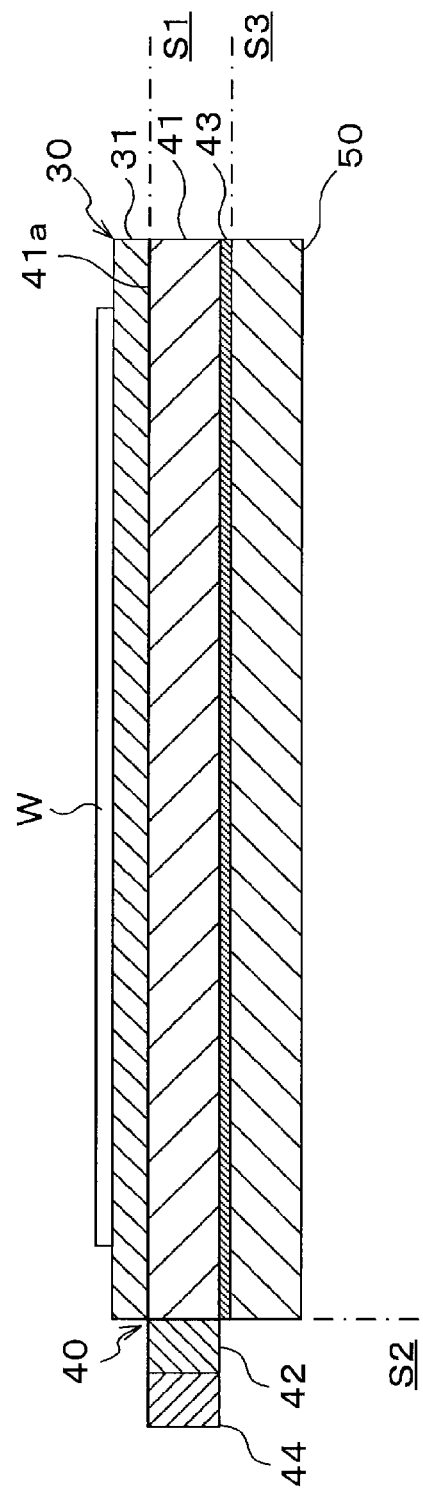
FIG. 5 is a cross-sectional view schematically illustrating a configuration of a stage.

Next, a configuration of the stage 10 will be described. FIG. 5 is a cross-sectional view schematically illustrating the configuration of the stage 10.

The stage 10 is configured to place the wafer W thereon in the state in which the stage 10 faces the rear surface of the imaging device D, and has a light transmitter 30 and a light illuminator 40, as illustrated in FIG. 5.

The light transmitter 30 is made of a light-transmissive material and is configured to have the wafer W placed thereon in the state in which the rear surface of the wafer W is in contact therewith, and has a flat plate member 31. The "light-transmissive material" is a material that transmits light having a wavelength in an inspection range. The light transmitter 30 is provided with a sandwiching mechanism (not illustrated) configured to sandwich the non-device-forming region R of the outer peripheral portion of the wafer W in order to hold the wafer W placed thereon.

The light illuminator 40 irradiates the wafer W with light, and is disposed in the region S1 vertically below the light transmitter 30.

The light illuminator 40 has a light guide plate 41 and a light source 42.

The light guide plate 41 is a flat plate member having a facing surface 41*a*, which faces the wafer W, with the light transmitter 30 interposed therebetween. The light guide plate 41 is formed in, for example, a square shape having a side length larger than the diameter of the wafer W in a plan view. In the present embodiment, in order to reinforce the strength of the light guide plate 41, a support member 43 is provided on a bottom surface of the light guide plate 41. As will be described later, the light guide plate 41 emits planar light toward the wafer W. The light guide plate 41 is disposed such that an imaging-device-forming region of the wafer W is included in a region that emits the planar light, in a plan view.

The light source 42 is provided in a region S2 laterally outside the light guide plate 41, and emits linear light toward one side end surface of the light guide plate 41. In order to emit linear light, the light source 42 includes, for example, a plurality of light emitting diodes (LEDs) provided along the side end surface of the light guide plate 41. The LEDs emit light which is diffused in the light guide plate 41 and transmitted through the light transmitter 30, and which includes light having a wavelength within the inspection range. The light having a wavelength in the inspection range is, for example, light having a wavelength in the visible light region, and may include light outside the visible light region, such as infrared rays, depending on the type of the imaging device D.

In addition, in the present embodiment, in order to release the heat of the LEDs of the light source 42 to the outside of the stage 10, a heat dissipation plate 44 is provided on the rear surface of the substrate (not illustrated) that supports the LEDs. The heat dissipation plate 44 is formed of, for example, a metal material. The heat dissipation plate 44 may be formed with a path through which a coolant such as water for cooling the LEDs of the light source 42 passes.

In the prober 1, the light guide plate 41 diffuses linear light emitted from the light source 42 and incident from the side end surface of the light guide plate 41 inside the light guide plate 41, and emits planar light from the facing surface 41*a*, which faces the wafer W.

Here, the light transmitter 30 will be further described.

In the prober 1, high flatness is used for the surface on which the wafer W is placed at the time of inspection. However, the flatness of the top surface of a ready-made light guide plate 41 is not high. Therefore, in the present embodiment, the light transmitter 30, which is manufactured separately from the light guide plate 41 and has an upper surface having high flatness, is provided above the light guide plate 41 of the light illuminator 40.

The light transmitter 30 may merely transmit the planar light emitted from the light guide plate 41 toward the wafer W, or may transmit the planar light while diffusing the same. By diffusing and transmitting the light, it is possible to irradiate the wafer W with light from the light transmitter 30 that has a more uniform in-plane light intensity distribution.

In order for the light transmitter 30 to transmit light while diffusing the same, for example, the flat plate member 31 is made of transparent glass, and the surface on the wafer W side thereof is formed as a sanded surface. As a result, the light emitted from the light guide plate 41 incident on the light transmitter 30 is emitted from the light transmitter 30 in the state of being diffused on the sanded surface.

In order for the light transmitter 30 to transmit light while diffusing the same, the flat plate member 31 may be formed of bubble quartz containing bubbles therein. When this light transmitter 30 is used, the light emitted from the light guide plate 41 incident on the light transmitter 30 passes through the light transmitter 30 and is emitted through the light transmitter 30 while being diffused by the bubbles in the light transmitter 30.

In order for the light transmitter 30 to transmit light while diffusing the same, the flat plate member 31 may be formed of transparent ceramic, such as sintered alumina. The transparent ceramic has grain boundaries and defects therein. Therefore, when the light transmitter 30 of this example is used, the light emitted from the light guide plate 41 incident on the light transmitter 30 passes through the light transmitter 30 and is emitted while being diffused by the above-mentioned grain boundaries and defects in the light transmitter 30.

In addition, in order for the light transmitter 30 to transmit light while diffusing the same, the flat plate member 31 may be configured by a holographic diffuser. The holographic diffuser is made by forming a hologram pattern (a collection of aperiodic uneven patterns of about 5 μm) on a glass substrate, such as a quartz glass substrate. When this light transmitter 30 is used, the light emitted from the light guide plate 41 incident on the light transmitter 30 passes through the light transmitter 30 and is emitted while being diffused by the hologram pattern of the flat plate member 31.

The stage 10 having the light transmitter 30 and the light illuminator 40 described above includes a temperature adjustment mechanism 50 for the wafer W in a region S3 below the light illuminator 40, specifically, in the region S3 below the support member 43 for the light guide plate 41. As the temperature adjustment mechanism, an existing wafer placement stage having a temperature adjustment function (hereinafter, referred to as "temperature adjustment stage") may be used. Since the existing temperature adjustment stage has a wafer attraction mechanism, the light illuminator 40 is attracted to and held on the temperature adjustment mechanism 50 by this attraction mechanism. In addition, the light transmitter 30 is held on the light illuminator 40 by being bonded and held by, for example, a transparent adhesive material.

Next, an exemplary inspection process on a wafer W using the prober 1 will be described. In the following description, it is assumed that one imaging device D is inspected in one inspection. However, a plurality of imaging devices D may be inspected at once in one inspection using the prober 1.

First, a wafer W is taken out from the FOUP of the loader 3 and is transported into the accommodation chamber 2. Further, the wafer W is placed on the stage 10 such that the rear surface of the imaging device D formed on the wafer W and the stage 10 face each other and the rear surface of the wafer W is in contact with the stage 10.

Next, the stage 10 is moved, and the probes 11a provided above the stage 10 come into contact with the electrodes E of the imaging device D to be inspected.

Then, the LEDs of the light source 42 of the light illuminator 40 are turned on, and light is incident on the side end surface of the light guide plate 41 from the light illuminator 40. The light incident on the light guide plate 41 is diffused inside the light guide plate 41, and is emitted from the facing surface 41a that faces the wafer W as planar light. The emitted light passes through the light transmitter 30, and the wafer W is irradiated with the light.

Along with irradiating the wafer W with the light, an inspection signal is input to the probes 11a. As a result, the imaging device D is inspected. During the inspection, the temperature of the wafer W is measured by a temperature measurement mechanism (not illustrated), and based on the result, the temperature adjustment mechanism 50 is controlled to adjust the temperature of the wafer W to a desired value, whereby the temperature of the imaging device D is adjusted to the desired value.

Thereafter, the same process as described above is repeated until inspection of all the imaging devices D is completed.

As described above, in the present embodiment, the stage 10 has the light transmitter 30, which is made of a light-transmissive material and configured to have the wafer W placed thereon, and the light illuminator 40 disposed in the region S1 below the light transmitter 30. Further, the light illuminator 40 has the light guide plate 41 having the facing surface 41a that faces the wafer W with the light transmitter 30 interposed therebetween, and the light source 42 provided in the region laterally outside the light guide plate 41. In the present embodiment, the light guide plate 41 diffuses the light emitted from the light source 42 incident from the side end surface of the light guide plate 41 inside the light guide plate 41, and emits the light in a planar shape from the facing surface 41a. Therefore, it is possible to inspect the back-illuminated imaging device D. Since it is not necessary to provide the probe card 11 with an opening for inspection, the number of probes 11a is not limited. Thus, it is possible to perform an inspection in a short time. Further, in the present embodiment, the light source 42 is provided in a region laterally outside the light guide plate 41. Thus, it is not necessary to form a cavity inside the stage 10 in order to dispose the light source 42. Therefore, the strength of the stage 10 is not impaired. In particular, when a plurality of imaging devices D is inspected at once, the strength of the stage 10 is important because of a large load applied to the stage 10.

In the present embodiment, the stage 10 has the temperature adjustment mechanism 50 in the region below the light guide plate 41. When the temperature adjustment mechanism for the wafer W is provided in the region above the light guide plate 41, specifically, when the temperature adjustment mechanism is provided between the light guide plate 41 and the wafer W, it is necessary to configure the temperature adjustment mechanism using a light-transmissive material. In contrast, since the stage 10 has the temperature adjustment mechanism 50 in the region below the light guide plate 41, it is possible to use the existing temperature adjustment stage as the temperature adjustment mechanism 50.

In the present embodiment, since the light illuminator 40 is constituted with the light source 42 including the plurality of LEDs and the light guide plate 41, it is possible to prevent enlargement of the stage 10, and further to prevent enlargement of the accommodation chamber 2 and the prober 1.

In the present embodiment, as a mechanism for holding the wafer W, a sandwiching mechanism configured to sandwich the non-device-forming region R of the outer peripheral portion of the wafer W is used. Therefore, since it is not necessary to form a hole to attract, hold, and support in the light transmitter 30, it is possible to prevent the hole for attracting, holding, and supporting from affecting the in-plane uniformity of the intensity distribution of the light illuminating the wafer W.

Second Embodiment

Figure 6:
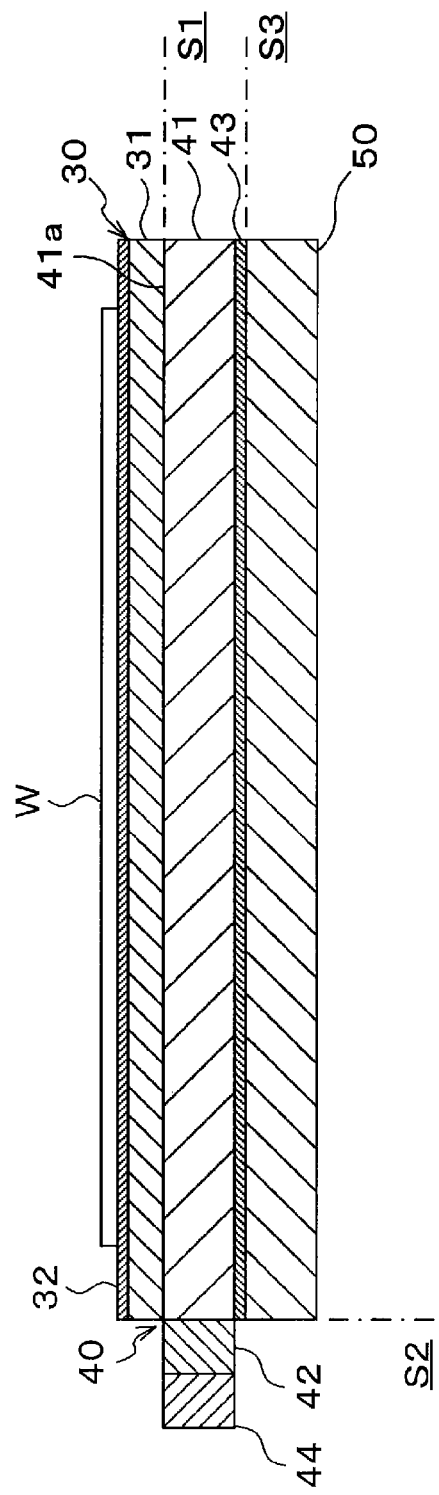
FIG. 6 is a cross-sectional view schematically illustrating a configuration of a stage included in a prober as an inspection apparatus according to a second embodiment.

FIG. 6 is a cross-sectional view schematically illustrating a configuration of the stage 10 included in the prober as an inspection apparatus according to a second embodiment.

In the stage 10 of the present embodiment, as illustrated in FIG. 6, the light transmitter 30 has a low-refractive index part 32 in addition to the flat plate member 31 that transmits light.

The low-refractive index part 32 has a refractive index lower than that of the flat plate member 31, and is provided on the wafer W side of the flat plate member 31 so as to overlap the flat plate member 31, and the rear surface of the wafer W placed on the stage 10 comes into contact with the low-refractive index part 32. For example, when the flat plate member 31 is made of quartz glass, the low-refractive index part 32 is formed using quartz glass that is different in type from that of the flat plate member 31 (e.g., quartz glass different from the flat plate member 31 in the type and proportion of impurities). As a result, the low-refractive index part 32 may have a refractive index lower than that of the flat plate member 31.

In addition, by using fluororesin as the material of the low-refractive index part 32 and adjusting materials to be added to the fluororesin, the low-refractive index part 32 can have a refractive index lower than that of the flat plate member 31.

The low-refractive index part 32 may be formed from an electro-optical crystal having an electro-optical effect in which the refractive index changes by applying an electric field thereto.

When the low-refractive index part 32 is quartz glass or an electro-optical crystal, the low-refractive index part 32 is formed through, for example, a CVD method, and when the low-refractive index part 32 is a fluororesin, the low-refractive index part is formed through, for example, spin coating.

In the present embodiment, among the light transmitted through the flat plate member 31, the light having a small incident angle with respect to the low-refractive index part 32 is incident on the low-refractive index part 32, passes through the low-refractive index part 32, and is emitted toward the wafer W. However, the light having a large incident angle with respect to the low-refractive index part 32 is not incident on the wafer W because the light is reflected by the surface of the low-refractive index part 32 on the flat plate member 31 side. As described above, in the present embodiment, since the incident angle of light from the flat plate member 31 to the low-refractive index part 32 is limited, the incident angle of light transmitted through the low-refractive index part 32 so as to irradiate the wafer W is also limited. That is, in the present embodiment, it is possible to limit the incident angle of the light with which the wafer W is irradiated. Therefore, it is possible to use the prober 1 even for an inspection in which the angle of incidence on the imaging device D needs to be limited.

It should be understood that the embodiments disclosed herein are illustrative and are not limiting in all aspects. The above-described embodiments may be omitted, replaced, or modified in various forms without departing from the scope and spirit of the appended claims.

The following configurations also belong to the technical scope of the present disclosure.

(1) An inspection apparatus for inspecting an inspection target device,
wherein the inspection target device formed on an inspection object is a back-illuminated imaging device into which light is incident from a rear surface which is a surface opposite a side on which a wiring layer is provided,
wherein the inspection apparatus includes a stage on which the inspection object is placed in a state in which the inspection object faces the rear surface of the imaging device,
wherein the stage includes:
a light transmitter made of a light-transmissive material and configured to have the inspection object placed thereon, and
a light illuminator disposed in an area below the light transmitter,
wherein the light illuminator includes:
a flat light guide plate having a facing surface that faces the inspection object, with the light transmitter interposed therebetween, and
a light source provided in a region laterally outside the light guide plate,
wherein the light guide plate is configured to diffuse light emitted from the light source and incident from a side end surface of the light guide plate inside the light guide plate, and to emit the light as planar light from the facing surface that faces the inspection object.

According to item (1), it is possible to inspect a back-illuminated imaging device. Since it is not necessary to provide the probe card with an opening for inspection, the number of probes is not limited. Thus, it is possible to perform an inspection in a short time. Further, in the present embodiment, the light source is provided in a region laterally outside the light guide plate. Thus, it is not necessary to form a cavity inside the stage in order to dispose the light source. Therefore, the strength of the stage is not impaired.

(2) The inspection apparatus described in item (1),
wherein the light transmitter transmits light from the light guide plate while diffusing the light.

According to item (2), it is possible to irradiate the inspection object from the light transmitter with light having a more uniform in-plane light intensity distribution.

(3) The inspection apparatus described in item (1) or (2),
wherein the stage includes, in a region below the light guide plate, a temperature adjustment mechanism configured to adjust temperature of the inspection object.

According to item (3), it is not necessary to configure the temperature adjustment mechanism using a light-transmissive material. Thus, it is possible to configure an inexpensive temperature adjustment mechanism such as an existing temperature adjustment stage.

(4) The inspection apparatus described in any one of items (1) to (3), wherein
the light transmitter includes a flat plate member made of a transparent material and a low-refractive index part provided above the flat plate member and having a refractive index lower than a refractive index of the flat plate member.

(5) An inspection method for inspecting an inspection target device,
wherein the inspection target device formed on an inspection object is a back-illuminated imaging device into which light is incident from a rear surface which is a surface opposite to a side on which a wiring layer is provided,
wherein the inspection method includes:
placing the inspection object on a light transmitter of the stage such that the rear surface of the imaging device faces the light transmitter which is made of a light-transmissive material;
irradiating light from a light source to be incident on a side end surface of a flat light guide plate, which is disposed to face the inspection object in a region under the light transmitter such that the light transmitter is interposed between the inspection object and the flat light guide plate, the light source being provided in a region below the light transmitter and laterally outside the light transmitter; and
diffusing the light emitted from the light source and incident on the side end surface of the light guide plate inside the light guide plate and emitting the light as planar light from a surface of the light guide plate facing the inspection object.

EXPLANATION OF REFERENCE NUMERALS

1: prober, 10: stage, 30: light transmitter, 40: light illuminator, 41: light guide plate, 41a: facing surface, 42: light source, D: back-illuminated imaging device, S1: region, S2: region, W: wafer

What is claimed is:
1. An inspection apparatus for inspecting an inspection target device,
wherein the inspection target device formed on an inspection object is a back-illuminated imaging device into which light is incident from a rear surface which is a surface opposite a side on which a wiring layer is provided, wherein the inspection apparatus comprises a stage on which the inspection object is placed in a state in which the inspection object faces the rear surface of the imaging device, wherein the stage includes:

a light transmitter made of a light-transmissive material and configured to have the inspection object placed thereon, and a light illuminator disposed in an area below the light transmitter, wherein the light illuminator includes:

a flat light guide plate having a facing surface that faces the inspection object with the light transmitter interposed therebetween, and a plurality of light sources provided in a region laterally outside the light guide plate and provided along a side end surface of the light guide plate, wherein the light guide plate is configured to diffuse light emitted from the plurality of light sources and incident from the side end surface of the light guide plate inside the light guide plate, and to emit the light as planar light from the facing surface that faces the inspection object.

2. The inspection apparatus of claim 1, wherein the light transmitter transmits light from the light guide plate while diffusing the light.

3. The inspection apparatus of claim 1, wherein the stage includes, in a region below the light guide plate, a temperature adjustment mechanism configured to adjust temperature of the inspection object.

4. The inspection apparatus of claim 1, wherein the light transmitter includes a flat plate member made of a transparent material and a low-refractive index part provided above the flat plate member and having a refractive index lower than a refractive index of the flat plate member.

5. An inspection method for inspecting an inspection target device, wherein the inspection target device formed on an inspection object is a back-illuminated imaging device into which light is incident from a rear surface which is a surface opposite to a side on which a wiring layer is provided, the inspection method comprising:

placing the inspection object on a light transmitter of a stage such that the rear surface of the imaging device faces the light transmitter which is made of a light-transmissive material;

irradiating light from a plurality of light sources to be incident on a side end surface of a flat light guide plate, which is disposed to face the inspection object in a region under the light transmitter such that the light transmitter is interposed between the inspection object and the flat light guide plate, the plurality of light sources being provided in a region below the light transmitter and laterally outside the light transmitter and being provided along the side end surface of the light guide plate; and diffusing the light emitted from the plurality of light sources and incident on the side end surface of the light guide plate inside the light guide plate and emitting the light as planar light from a surface of the light guide plate facing the inspection object.

* * * * *